(12) United States Patent
Fukuzumi et al.

(10) Patent No.: US 7,145,796 B2
(45) Date of Patent: Dec. 5, 2006

(54) SEMICONDUCTOR INTEGRATED CIRCUIT DEVICE

(75) Inventors: Yoshiaki Fukuzumi, Yokohama (JP); Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 10/933,323

(22) Filed: Sep. 3, 2004

(65) Prior Publication Data
US 2005/0207216 A1    Sep. 22, 2005

(30) Foreign Application Priority Data
Mar. 18, 2004   (JP)   ............................. 2004-078721

(51) Int. Cl.
*G11C 11/00* (2006.01)
(52) U.S. Cl. .................. 365/158; 365/209; 365/222.5; 365/243.5
(58) Field of Classification Search ................ 365/158, 365/209, 225.5, 243.5, 171, 172
See application file for complete search history.

(56) References Cited

U.S. PATENT DOCUMENTS

| | | | |
|---|---|---|---|
| 6,351,410 B1 | 2/2002 | Nakao et al. | |
| 6,654,278 B1 * | 11/2003 | Engel et al. | 365/158 |
| 6,750,068 B1 * | 6/2004 | Chen | 438/3 |
| 6,865,109 B1 * | 3/2005 | Covington | 365/173 |
| 6,920,064 B1 * | 7/2005 | Zhu et al. | 365/171 |
| 6,956,765 B1 * | 10/2005 | Saito et al. | 365/158 |

OTHER PUBLICATIONS

Roy Scheuerlein, et al., "A 10NS Read and Write Non-Volatile Memory Array Using a Magnetic Tunnel Junction and FET Switch in Each Cell", 2000 IEEE International Solid-State Circuits Conference, Feb. 7,8 and 9, 2000, pp. 128-129.

* cited by examiner

*Primary Examiner*—Richard Elms
*Assistant Examiner*—Toan Le
(74) *Attorney, Agent, or Firm*—Oblon, Spivak, McClelland, Maier & Neustadt, P.C.

(57) ABSTRACT

A semiconductor integrated circuit device includes a magneto-resistive effect element and a plug. The magneto-resistive effect element includes a first magnetic layer whose magnetization direction is fixed and a second magnetic layer whose magnetization direction can be changed. The plug is formed to penetrate through the second magnetic layer in the film thickness direction of the second magnetic layer and used to apply a write magnetic field to the second magnetic layer.

16 Claims, 14 Drawing Sheets

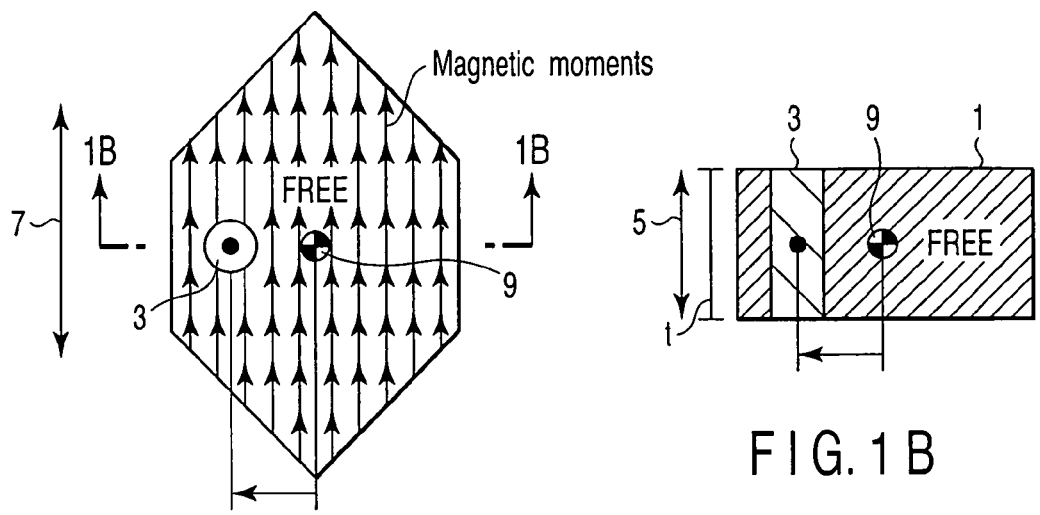
FIG. 1A
FIG. 1B
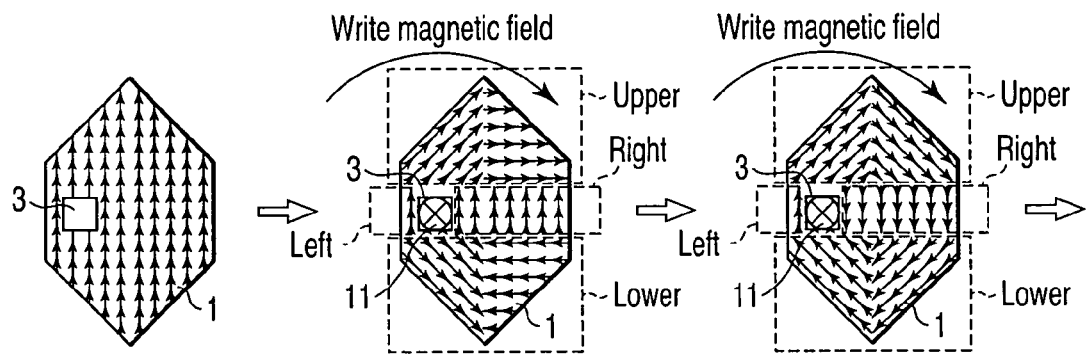
FIG. 2A   FIG. 2B   FIG. 2C
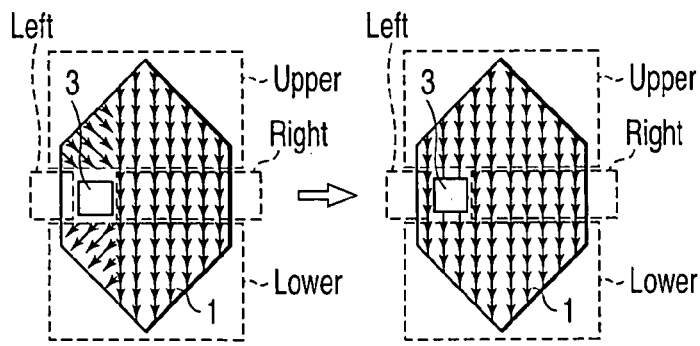
FIG. 2D   FIG. 2E

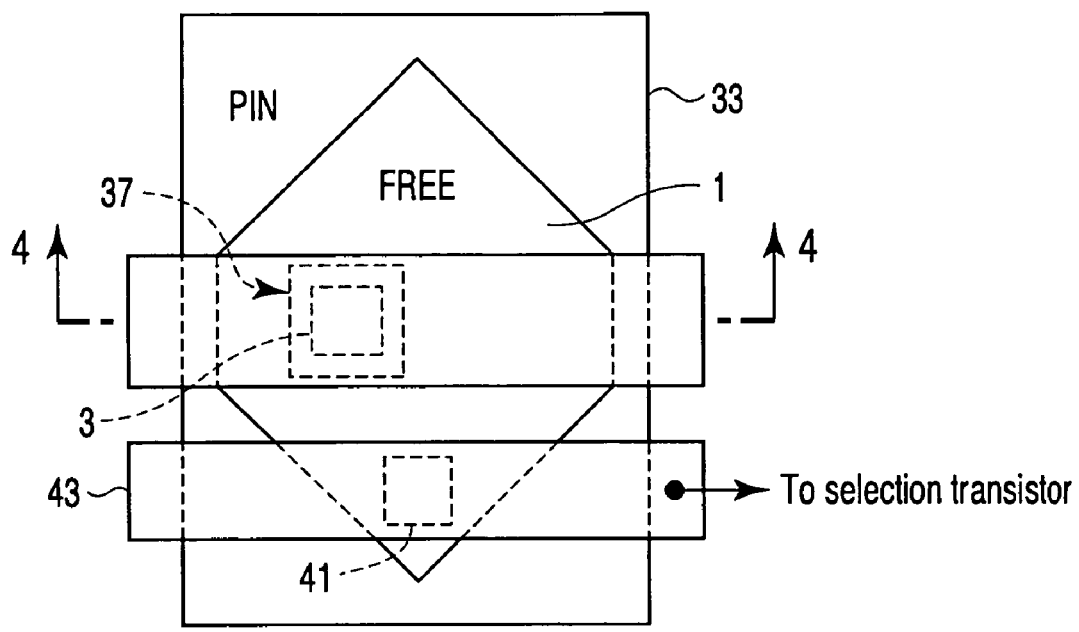
F I G. 3
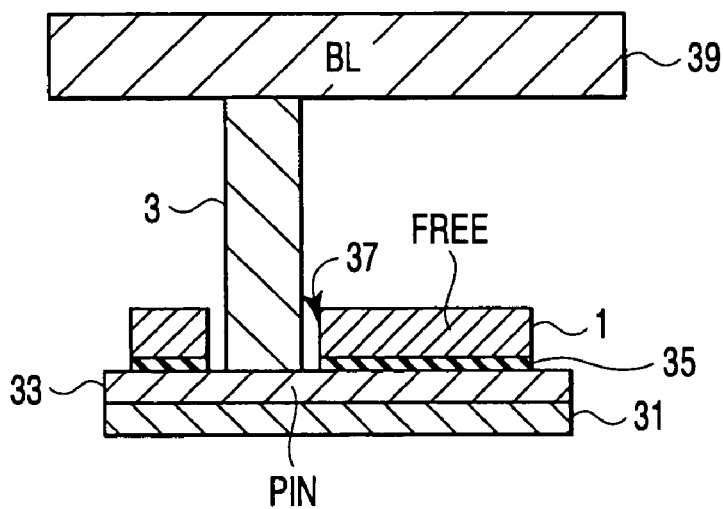
F I G. 4

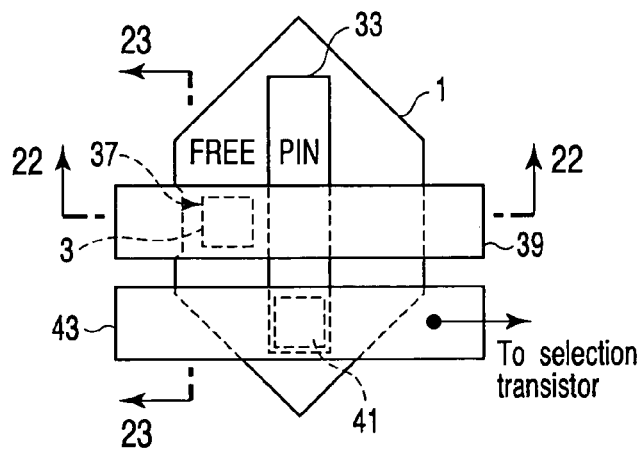
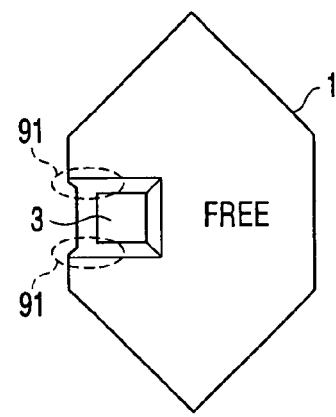
F I G. 2 1 A          F I G. 2 1 B
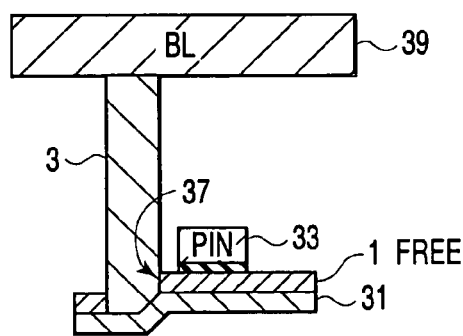
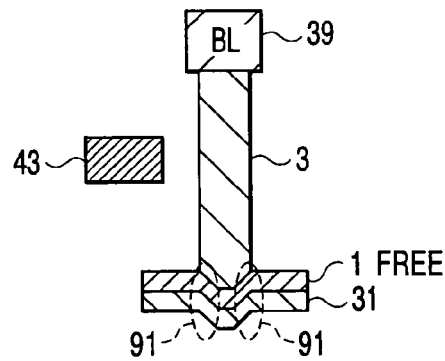
F I G. 2 2          F I G. 2 3
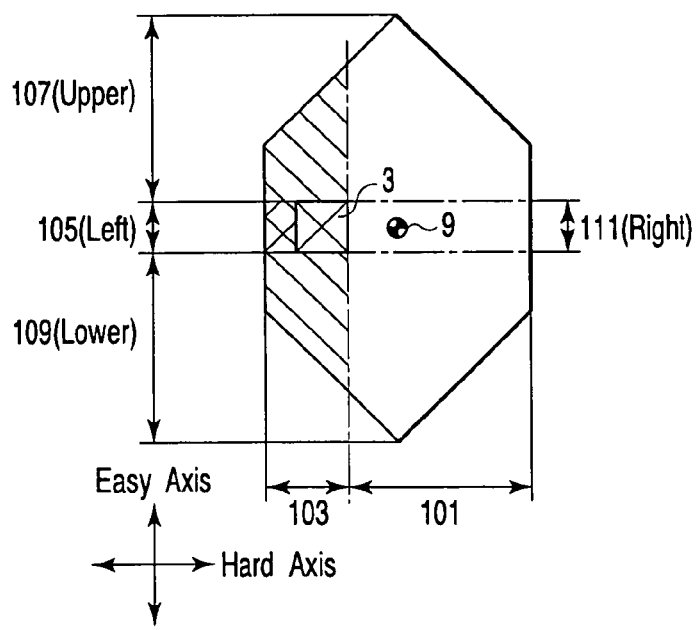
F I G. 2 4

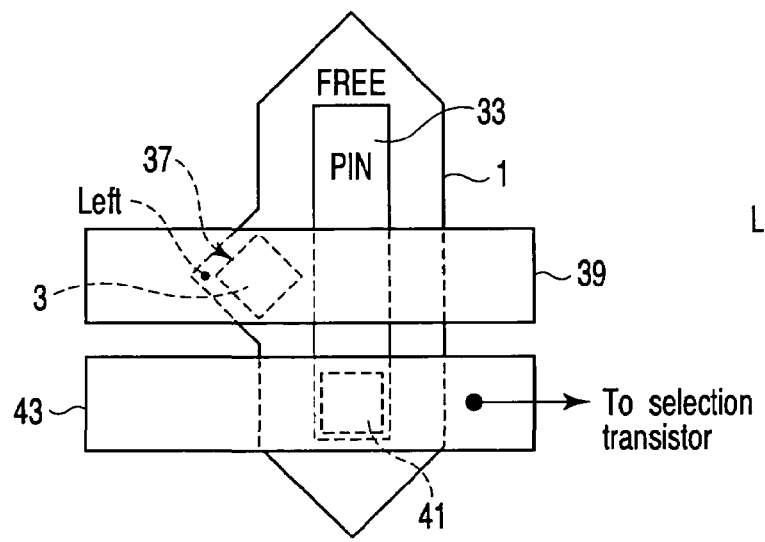
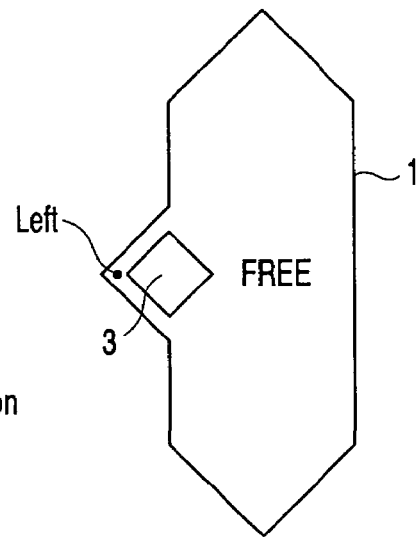
FIG. 25A          FIG. 25B
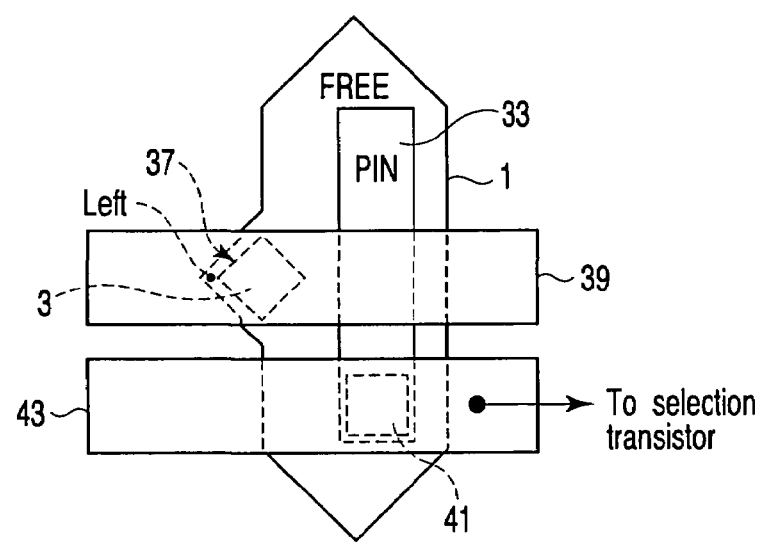
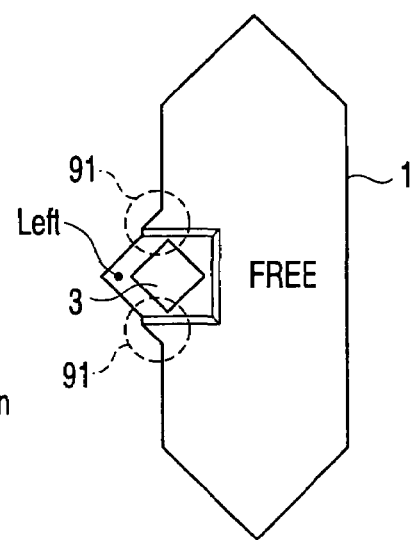
FIG. 26A          FIG. 26B

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2004-078721, filed Mar. 18, 2004, the entire contents of which are incorporated herein by reference.

BACKGROUND OF THE INVENTION

1. Field of the Invention

This invention relates to a semiconductor integrated circuit device and more particularly to a magnetic semiconductor memory having magneto-resistive effect elements.

2. Description of the Related Art

As one of nonvolatile semiconductor memories of a next generation, much attention is given to a magnetic semiconductor memory. Each of memory cells in the semiconductor memory includes a magneto-resistive effect element whose resistance varies according to the magnetization direction thereof and utilizes the magneto-resistive effect element as information storage means. The magneto-resistive effect element includes a fixed layer (pinned layer) in which the magnetization direction is fixed and a free layer in which the magnetization direction can be freely changed. The resistance thereof is changed according to whether the magnetization direction of the free layer is parallel or anti-parallel to the magnetization direction of the fixed layer. A variation in the resistance is set to correspond to "0", "1" of storage information, for example.

Further, in the recent magnetic semiconductor memory, a tunneling magneto-resistive element which has a tunnel insulating film between the free layer and the fixed layer and in which a difference (MR ratio) between the resistance at the parallel time and the resistance at the anti-parallel time is set large so that whether storage information is "0" or "1" can be easily determined is developed. The magnetic semiconductor memory is described in a known document, for example, document 1.

Document 1: Roy Scheuerlein et al., "A 10 ns Read and Write Non-Volatile Memory Array Using a Magnetic Tunnel Junction and FET Switch in each Cell", 2000 IEEE International Solid-State Circuits Conference, Feb. 8, 2000, p128–129.

The magnetic semiconductor memory has received much attention as one of the nonvolatile semiconductor memories of the next generation, but it has some problems to be solved for practical use.

One of the problems is that a write current used to write information into the magneto-resistive effect element is large. There are various reasons why the write current becomes large and one of the reasons as viewed from the practical viewpoint is that a magnetic field (which is hereinafter referred to as a switching magnetic field) required for changing the magnetization direction of the free layer must have certain strength. If the switching magnetic field is weak, for example, a variation in the switching magnetic field caused by a thermal disturbance cannot be absorbed as a margin and there occurs a possibility that storage information will be unexpectedly destroyed. Under this circumstance, the switching magnetic field is required to have certain strength.

In order to generate a strong magnetic field, a large write current is required. If a large write current is used, a transistor having large driving ability becomes necessary. In order to design a transistor having large driving ability, sufficiently large channel width is required. This increases an area of the peripheral circuit of the magnetic semiconductor memory and makes it difficult to meet the market requirement of "large-scale memory capacity and small chip".

Further, in order to cause a large current flow, a heavy load tends to be applied to the wirings of the semiconductor integrated circuit device and a bad influence will be given to the reliability of the wirings, for example, the reliability relating to the service life of the wirings.

In order to prevent an increase in the area of the chip and solve the problem of deterioration of the reliability of the wirings caused by passing a large current, it is preferable to enhance the efficiency of generation of a magnetic field with respect to a current and generate a stronger magnetic field by use of a smaller current. Simply stated, the wrings are surrounded by a magnetic body and the magnetic body is magnetized by a magnetic field generated by a current. This is a yoke. The wirings having a yoke can generate a stronger magnetic field by a small current in comparison with the wirings having no yoke. Thus, the write current can be reduced.

However, in order to form the wirings having the yoke, it is necessary to surround the wirings with the magnetic body. Therefore, the process becomes complicated and more difficult. Of course, the number of manufacturing steps of forming the magnetic body increases. Further, factors to be made clear, for example, the influence given to the wirings by the yoke, the influence by the wirings having the yoke on an integrated circuit and the like must be considered.

BRIEF SUMMARY OF THE INVENTION

A semiconductor integrated circuit device according to a first aspect of the present invention comprises a magneto-resistive effect element including a first magnetic layer whose magnetization direction is fixed and a second magnetic layer whose magnetization direction can be changed, and a plug formed to penetrate through the second magnetic layer in a film thickness direction of the second magnetic layer, the plug being used to apply a write magnetic field to the second magnetic layer, wherein magnetic moments of the second magnetic layer are substantially in a same direction under a zero magnetic field.

A semiconductor integrated circuit device according to a second aspect of the present invention comprises a magneto-resistive effect element including a first magnetic layer whose magnetization direction is fixed and a second magnetic layer whose magnetization direction can be changed, and a plug formed to penetrate through the second magnetic layer in a film thickness direction of the second magnetic layer, the plug being used to apply a write magnetic field to the second magnetic layer.

A manufacturing method of a semiconductor integrated circuit device according to a third aspect of the present invention comprises: forming a first magnetic layer on a lead electrode; forming an opening in the first magnetic layer, the opening exposing the lead electrode; forming a plug in a column shape on a portion of the lead electrode which is exposed via the opening; forming films on side surfaces of the plug, the film containing a material different from a material of the first magnetic layer and a material of the lead electrode; partly and selectively removing the first magnetic layer and lead electrode by using the films as a mask; forming a tunnel insulating film on a remaining portion of the first magnetic layer; forming a second magnetic layer on the tunnel insulating film; and processing the tunnel insulating film and second magnetic layer into a shape of a magneto-resistive effect element.

BRIEF DESCRIPTION OF THE SEVERAL VIEWS OF THE DRAWING

FIG. 1A is a plan view showing a free layer provided in a semiconductor integrated circuit device according to a first embodiment of this invention;

FIG. 1B is a cross-sectional view taken along the 1B—1B line of FIG. 1A;

FIGS. 2A, 2B, 2C, 2D and 2E are plan views showing states in which the magnetization direction of the free layer shown in FIG. 1 is reversed;

FIG. 3 is a plan view showing an example of the structure of a magneto-resistive effect element provided in the semiconductor integrated circuit device according to the first embodiment of this invention;

FIG. 4 is a cross-sectional view taken along the 4—4 line of FIG. 3;

FIG. 21A is a plan view showing an example of the structure of a magneto-resistive effect element provided in a semiconductor integrated circuit device according to a third embodiment of this invention;

FIG. 21B is a plan view showing a free layer shown in FIG. 21A;

FIG. 22 is a cross-sectional view taken along the 22—22 line of FIG. 21A;

FIG. 23 is a cross-sectional view taken along the 23—23 line of FIG. 21A;

FIG. 24 is a plan view showing regional division of the free layer of the magneto-resistive effect element provided in a semiconductor integrated circuit device according to the third embodiment of this invention;

FIG. 25A is a plan view showing a first example of the structure of a magneto-resistive effect element provided in a semiconductor integrated circuit device according to a fourth embodiment of this invention;

FIG. 25B is a plan view showing a free layer shown in FIG. 25A;

FIG. 26A is a plan view showing a second example of the structure of the magneto-resistive effect element provided in the semiconductor integrated circuit device according to the fourth embodiment of this invention;

FIG. 26B is a plan view showing a free layer shown in FIG. 26A;

DETAILED DESCRIPTION OF THE INVENTION

Figure 5:
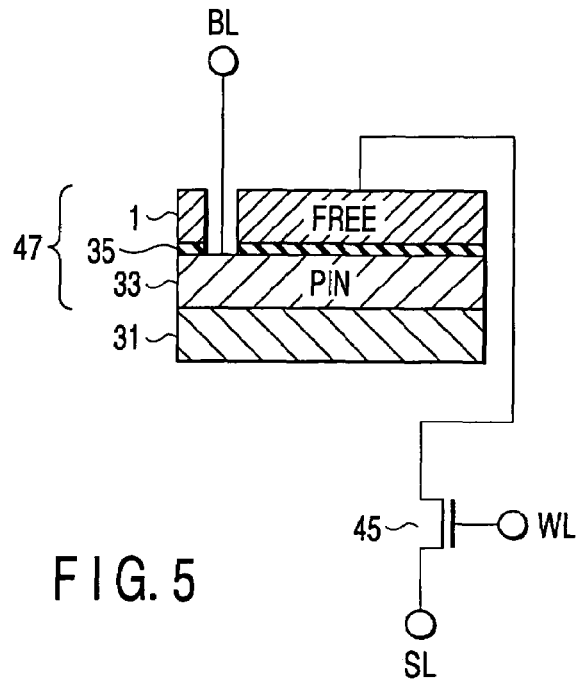
FIG. 5 is an equivalent circuit diagram showing a first example of a memory cell provided in the semiconductor integrated circuit device according to the first embodiment of this invention.

There will now be described embodiments of this invention with reference to the accompanying drawings. In this explanation, common reference symbols are attached to like portions throughout the drawings.

(First Embodiment)

FIG. 1A is a plan view showing a free layer provided in a semiconductor integrated circuit device according to a first embodiment of this invention and FIG. 1B is a cross-sectional view taken along the 1B—1B line of FIG. 1A.

As shown in FIGS. 1A, 1B, a free layer (FREE) 1 is a magnetic layer containing a magnetic body, for example, a ferromagnetic body. The free layer 1 has a plug (hereinafter referred to as a write plug) 3. The write plug 3 is formed to penetrate through the free layer 1 in the film thickness direction (indicated by an arrow 5 in FIG. 1B) of the free layer 1. The directions of magnetic moments of the free layer 1 are changed by passing a current (hereinafter referred to as a write current) through the write plug 3. The write current causes a write magnetic field in the free layer 1. The direction of the write magnetic field is changed to a clockwise direction or counterclockwise direction according to a direction in which the write current is passed. According to the change in the direction of the write magnetic field, the directions of the magnetic moments of the free layer 1 are changed. The free layer 1 itself has a stronger tendency toward becoming "one magnetic domain (single magnetic domain)" with a decrease in the size of the free layer 1. If the free layer 1 has a stronger tendency towards the single magnetic domain, the magnetic moments of the free layer 1 are substantially in a same direction (indicated by an arrow 7 in FIG. 1A, for example) under a "zero magnetic field" state before the write magnetic field is applied and after the write magnetic field is applied (exchange interaction). In this specification, the above state is called a "parallel state". Further, in this example, in order to attain a method for speeding up the "parallel state" setup process, the write plug 3 is formed in a position deviated from the center of mass 9 of the free layer 1. When a write current is passed through the write plug 3 set in the position deviated from the center of mass 9, the magnetic moments of the free layer 1 is reversed. This state is shown in FIGS. 2A to 2E.

As shown in FIG. 2A, in the zero magnetic field state, the magnetic moments of the free layer 1 are substantially in a same direction. In this example, the magnetic moments are set in a direction from the lower position to the upper position of the drawing sheet.

As shown in FIG. 2B, a write current 11 is caused to flow through the write plug 3. In this case, assume that the write current 11 flows in a direction from the front surface side to the rear surface side of the drawing sheet. Then, a clockwise magnetic field (clockwise write magnetic field) around the write plug 3 is generated according to the "corkscrew rule". As shown in FIG. 2B, the magnetization directions (spin directions) in the upper region, lower region and left region are set parallel or perpendicular to the clockwise magnetic field with the write plug 3 set as a center immediately after the write current 11 starts to flow. That is, the free layer 1 itself starts to function as a "yoke".

As shown in FIG. 2C, as the write current 11 increases, a portion of the free layer 1 which functions as the yoke further extends, and finally, the magnetization direction of the right region is reversed. At the time of application of the magnetic field, the magnetic moments of the free layer 1 draw a clockwise circle around the write plug 3.

As shown in FIG. 2D, when the write current 11 is interrupted, the magnetic moments of the free layer 1 tends to return to the parallel state due to the exchange interaction. It is considered that the tendency toward the parallel state due to the exchange interaction will be strengthened by causing the circular magnetic moments formed in the free layer 1 to be unbalanced. In this example, the circular magnetic moments are unbalanced by causing the central point of the circular magnetic moments to be offset from the center of mass 9 of the free layer 1. One example of off-centering is to set the write plug 3 in a position deviated from the center of gravity 9 of the free layer 1. In the unbalanced circular magnetic moments, the re-arrangement starts to be set up toward the more stable state under the zero magnetic field. In the free layer 1 of this example, a portion occupied by the right region is larger than a portion occupied by the left region with the write plug 3 set as a center. Therefore, the magnetic moments in the right region become dominant and the re-arrangement starts to be set up. The magnetic moments in the right region are different from the magnetic moments in the left region by 180°. Therefore, the magnetic domain wall which lies between the right region and the left region is gradually driven from the right region to the left region by causing the magnetic moments in the right region to become dominant.

As shown in FIG. 2E, the magnetic moments in the left region is finally reversed according to the magnetic moments in the right region and the magnetic moments the free layer 1 are substantially in a same direction under the zero magnetic field. In this example, the magnetic moments are reversed by 180° and are set from the upper portion to the lower portion of the drawing sheet. That is, the magnetic moments are reversed.

With the free layer 1, the write plug 3 which penetrates through the free layer in a film thickness direction of the free layer 1 and applies the write magnetic field to the free layer 1 is provided. Therefore, a configuration in which the free layer 1 itself contains the yoke can be formed at the time of application of the write magnetic field. By causing the free layer 1 itself to have the yoke, the efficiency of generation of the magnetic field with respect to the write current can be enhanced and the magnetic moments can be reversed by use of a smaller write current 3.

Further, the magnetic moments of the free layer 1 is set to a balanced state in the zero magnetic field. Therefore, an advantage that the free layer 1 can be applied to a magneto-resistive effect element of a typical semiconductor integrated circuit device which is available at present can be attained.

Further, occurrence of the phenomenon that the magnetic moments of the free layer 1 are set to a balanced state in the zero magnetic field can be accelerated by causing the circular magnetic moments of the free layer 1 to be unbalanced at the time of application of the write magnetic field.

The stability of the magnetic moments against the thermal disturbance can be enhanced by increasing the film thickness t of the free layer 1. Even if the free layer 1 is made thick or formed in a multi-layered configuration, it is not necessary to increase the write current. Therefore, in a highly miniaturized semiconductor memory, sufficiently high stability against thermal disturbance can be securely acquired.

Next, an example of the magneto-resistive effect element using the free layer 1 is explained below.

FIG. 3 is a plan view showing an example of the structure of a magneto-resistive effect element provided in the semiconductor integrated circuit device according to the first embodiment of this invention and FIG. 4 is a cross-sectional view taken along the 4—4 line of FIG. 3.

As shown in FIGS. 3, 4, a fixed layer (pinned layer: PIN) 33 is formed on a lead layer 31. The lead layer 31 is a conductive layer formed of a non-magnetic body. The fixed layer 33 is a magnetic layer containing a magnetic body, for example, a ferromagnetic body. The magnetic moments of the fixed layer 33 are fixed in a certain direction.

In this example, an MTJ element having a magnetic tunnel junction (MTJ) is shown as one example of a magneto-resistive effect element. A tunnel insulating film 35 is formed on the fixed layer 33. A free layer 1 is formed on the tunnel insulating film 35. For example, an opening 37 is formed in the free layer 1 and tunnel insulating film 35 to reach the fixed layer 33. The opening 37 is formed in a position deviated from the center of mass of the free layer 1. A write plug 3 electrically connected to the fixed layer 33 is formed in the opening 37. The write plug 3 is electrically connected to a bit line (BL) 39. For example, a plug 41 is electrically connected to the upper surface of the free layer 1. The plug 41 is electrically connected to a wiring 43. For example, the wiring 43 is electrically connected to a selection transistor. The write plug 3 in this example is not formed in contact with the free layer 1. In this example, the electrical path at the data write time and at the data read time is formed in an order of the bit line 39~write plug 3~lead electrode 31~fixed layer 33/tunnel insulating film 35/free layer 1~plug 41~selection transistor. If the write plug 3 is formed in contact with the free layer 1, the bit line 39 is short-circuited to the free layer 1 at the data read time.

In this example, the write plug 3 is electrically connected to the fixed layer 33, but the write plug 3 may be directly electrically connected to the lead electrode 31.

Next, an example of the memory cell using the magneto-resistive effect element is explained.

(First Embodiment: First Example of Memory Cell)

FIG. 5 is an equivalent circuit diagram showing a first example of a memory cell provided in the semiconductor integrated circuit device according to the first embodiment of this invention.

As shown in FIG. 5, a memory cell in the first example includes one selection transistor 45 and one magneto-resistive effect element 47 in an equivalent circuit configuration. In this specification, the configuration is called 1T1MTJ (one-transistor/one-magnetic tunnel junction) for convenience. The gate of the selection transistor 45 in this example is electrically connected to a word line WL, the source thereof is electrically connected to a source line SL and the drain thereof is electrically connected to the free layer 1 of the magneto-resistive effect element 47. The magneto-resistive effect element 47 is the same as the magneto-resistive effect element shown in FIGS. 3, 4 and the fixed layer 33 is connected to a bit line BL.

When data is written, the selection transistor 45 is turned on to connect the bit line BL to the source line SL. After this, a current is caused to flow from the bit line BL to the source line SL according to write data. Alternatively, a current is caused to flow from the source line SL to the bit line BL. A value of the current flowing at the data write time may be set equal to a value of the current which causes a magnetic field stronger than the switching magnetic field of the free layer 1 to be generated, for example.

Like the case wherein data is written, when data is read out, the selection transistor 45 is turned on to connect the bit line BL to the source line SL. After this, for example, it is determined whether readout data is "0" or "1" according to an amount of the current flowing from the bit line BL to the source line SL. In this case, however, a value of the current flowing at the data read time is set to a value of the current which causes a magnetic field weaker than the switching magnetic field of the free layer 1 to be generated, for example. As a result, inadvertent inversion of data can be prevented at the data readout time.

Figure 6:
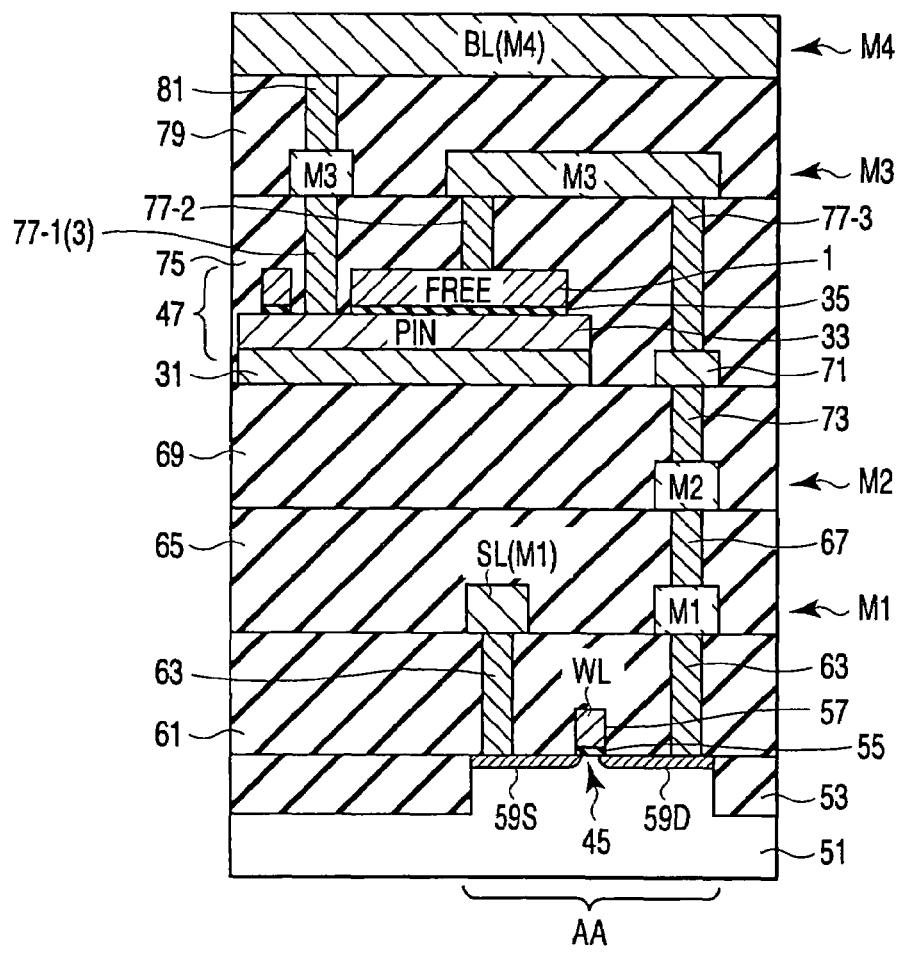
FIG. 6 is a cross-sectional view showing an example of the structure of the first example of the memory cell provided in the semiconductor integrated circuit device according to the first embodiment of this invention.

FIG. 6 is a cross-sectional view showing an example of the structure of the first example of the memory cell provided in the semiconductor integrated circuit device according to the first embodiment of this invention.

As shown in FIG. 6, an element isolation region, for example, a shallow trench isolation (STI) region 53 containing silicon dioxide is formed on a semiconductor substrate, for example, a P-type silicon substrate 51. The STI region 53 defines an element region active area (AA) on the substrate 51. In AA, a selection transistor 45 is formed. The selection transistor includes a gate insulating film 55, gate electrode 57 and N-type regions 59 (N-type source region 59S, N-type drain region 59D). The gate insulating film 55 is formed on AA and formed of an insulating film containing silicon dioxide, for example. The gate electrode 57 is formed on the gate insulating film 55 and functions as a word line WL used to specify the row of the memory cell array. The N-type source region 59S is electrically connected to the source line SL via a first-layered plug 63. The first-layered plug 63 is formed in a first-layered inter-level insulating film 61 to connect the substrate 51 or the N-type region 59 formed in the substrate 51 to a first-layered metal layer (M1). The source line SL in this example is formed by use of the first-layered metal layer (M1). A second-layered inter-level insulating film 65 is formed on the first-layered inter-level insulating film 61 and first-layered metal layer (M1). A second-layered metal layer (M2) is formed on the second-layered inter-level insulating film 65. A second-layered plug 67 is formed in the second-layered inter-level insulating film 65 to connect the first-layered metal layer (M1) and second-layered metal layer (M2) to each other. A third-layered inter-level insulating film 69 is formed on the second-layered inter-level insulating film 65 and second-layered metal layer (M2). A lead electrode 31 and wiring 71 are formed on the third-layered inter-level insulating film 69. A magneto-resistive effect element 47 is formed on the lead electrode 31. The wiring 71 is a wiring formed of the same conductive layer as the lead electrode 31. A third-layered plug 73 is formed in the third-layered inter-level insulating film 69 to connect the second-layered metal layer (M2) and wiring 71 to each other. A fourth-layered inter-level insulating film 75 is formed on the third-layered inter-level insulating film 69, lead electrode 31, wiring 71 and magneto-resistive effect element 47. A third-layered metal layer (M3) is formed on the fourth-layered inter-level insulating film 75. Fourth-layered plugs 77 are formed in the fourth-layered inter-level insulating film 75. In the structure shown in FIG. 6, three types of fourth-layered plugs 77 are provided. A plug 77-1 connects the third-layered metal layer (M3) and fixed layer 33 to each other. A plug 77-2 connects the third-layered metal layer (M3) and free layer 1 to each other. A plug 77-3 connects the third-layered metal layer (M3) and wiring 71 to each other. A fifth-layered inter-level insulating film 79 is formed on the fourth-layered inter-level insulating film 75 and third-layered metal layer (M3). A fourth-layered metal layer (M4) is formed on the fifth-layered inter-level insulating film 79. Bit lines BL are formed by use of the fourth-layered metal layer (M4). A fifth-layered plug 81 connects the third-layered metal layer (M3) and fourth-layered metal layer (M4) to each other.

In the memory cell in the first example, the number of selection transistors 45 for each memory cell is one and the number of selection transistors 45 is minimum. Therefore, the advantage that the integration density can be easily enhanced can be attained based on the memory cell in the first example.

(First Embodiment: Second Example of Memory Cell)

Figure 7:
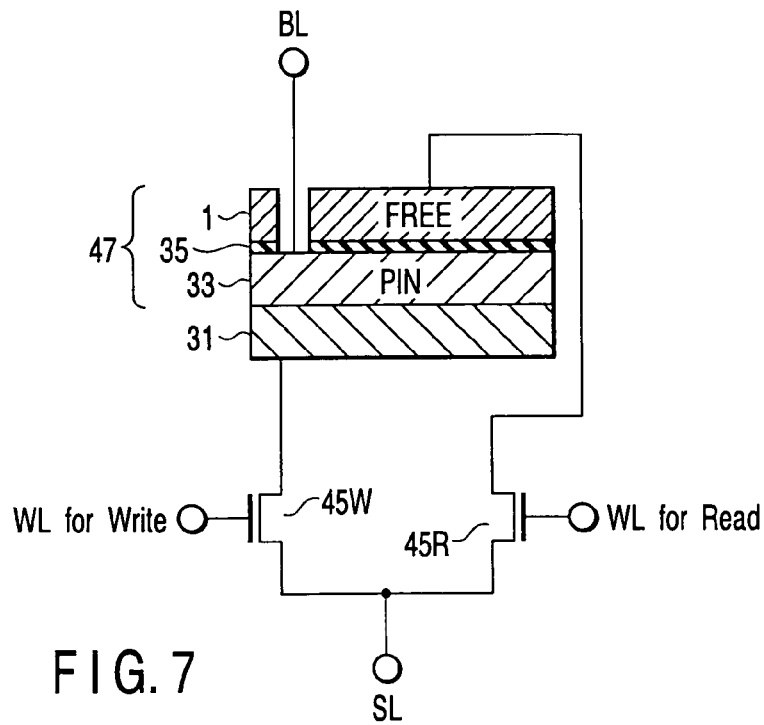
FIG. 7 is an equivalent circuit diagram showing a second example of the memory cell provided in the semiconductor integrated circuit device according to the first embodiment of this invention.

FIG. 7 is an equivalent circuit diagram showing a second example of the memory cell provided in the semiconductor integrated circuit device according to the first embodiment of this invention.

As shown in FIG. 7, the memory cell in the second example is different from the memory cell in the first example in that it is configured by 2T1MTJ. More specifically, the number of selection transistors 45 used in the memory cell in the first example is one and two selection transistors 45 including a read selection transistor 45R and write selection transistor 45W are provided in the memory cell in the second example. The gate of the read selection transistor 45R is electrically connected to a read selection word line "WL for Read" and the gate of the write selection transistor 45W is electrically connected to a write selection word line "WL for Write".

When data is written, the write selection transistor 45W is turned on, the read selection transistor 45R is turned off and the bit line BL is connected to the source line SL. After this, a current is caused to flow from the bit line BL to the source line SL or from the source line SL to the bit line BL according to write data.

On the other hand, when data is read out, the write selection transistor 45W is turned off, the read selection transistor 45R is turned on and the bit line BL is connected to the source line SL via the fixed layer 33, tunnel insulating film 35 and free layer 1. After this, whether readout data is "0" or "1" is determined according to an amount of a current flowing from the bit line BL to the source line SL, for example.

A value of the current flowing at the data write time and a value of the current flowing at the data read time may be the same as those used in the case of at the data write and read times of the first example.

Figure 8:
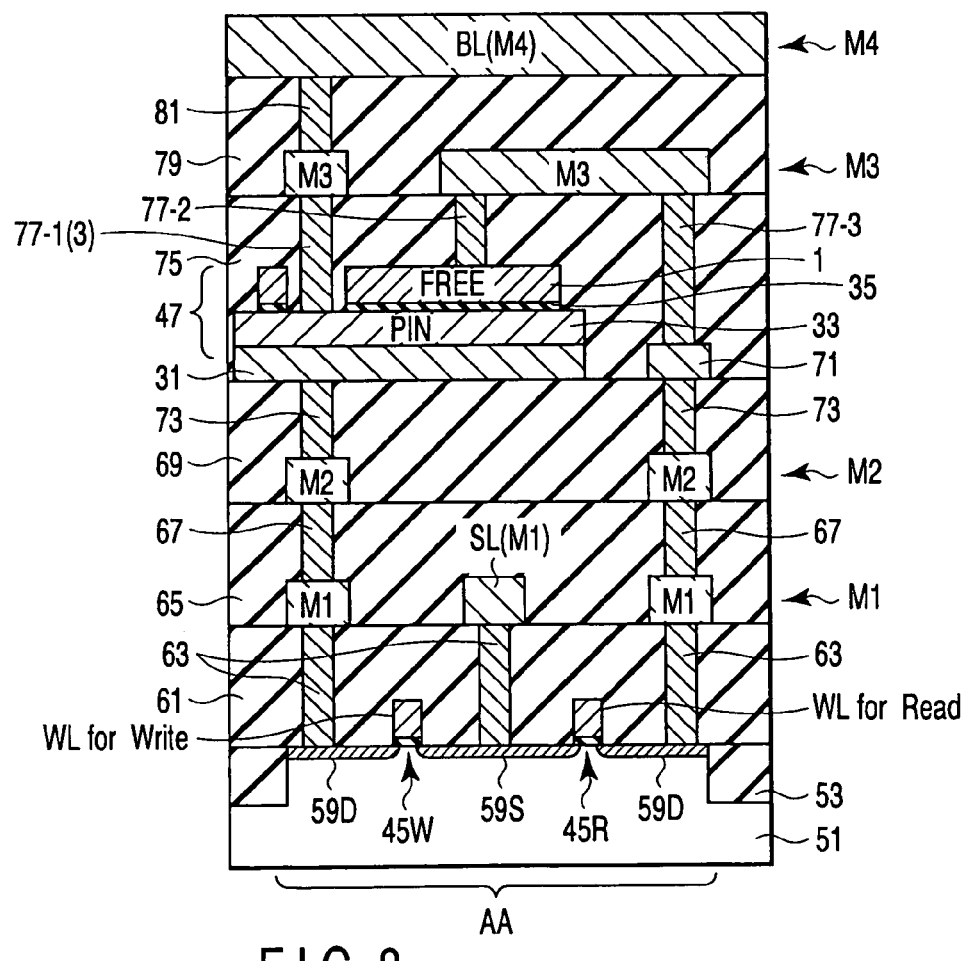
FIG. 8 is a cross-sectional view showing an example of the structure of the second example of the memory cell provided in the semiconductor integrated circuit device according to the first embodiment of this invention.

FIG. 8 is a cross-sectional view showing an example of the structure of the second example of the memory cell provided in the semiconductor integrated circuit device according to the first embodiment of this invention.

In FIG. 8, the same reference symbols are attached to portions which are the same as those of FIG. 6 and the repetitive explanation thereof is omitted.

In the memory cell of the second example, a current flowing between the bit line BL and the source line SL flows relatively linearly in portions above and below the free layer in comparison with the current in the case of the memory cell of the first example by further providing a plug directly below the plug which penetrates through the free layer. As a result, the spatial distribution of the magnetic field intensity at the write time is improved and a more stable write characteristic can be realized.

(First Embodiment: Third Example of Memory Cell)

Figure 9:
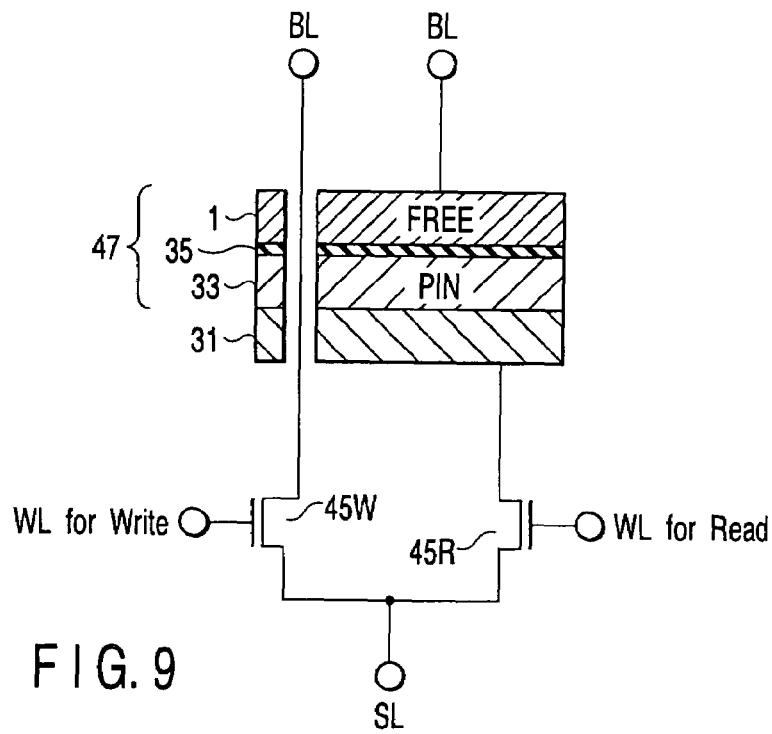
FIG. 9 is an equivalent circuit diagram showing a third example of the memory cell provided in the semiconductor integrated circuit device according to the first embodiment of this invention.

FIG. 9 is an equivalent circuit diagram showing a third example of the memory cell provided in the semiconductor integrated circuit device according to the first embodiment of this invention.

As shown in FIG. 9, like the memory cell of the second example, the memory cell of the third example is 2T1MTJ. The memory cell in the third example is different from the memory cell in the second example in that the current passage formed at the data write time is separated from the current passage formed at the data read time. Specifically, the current passage formed at the data write time is formed to penetrate through the magneto-resistive effect element 47 and passes through the MTJ, for example. Further, the current passage formed at the data read time is formed to connect one end of the magneto-resistive effect element 47 to the bit line BL and connect the other end thereof to the read selection transistor 45R and passes through the MTJ, for example.

One of the advantages in the circuit configuration of the memory cell in the third example is that the bit line used at the data write time and the bit line used at the read time can be separated and, of course, they can be commonly used.

Figure 10:
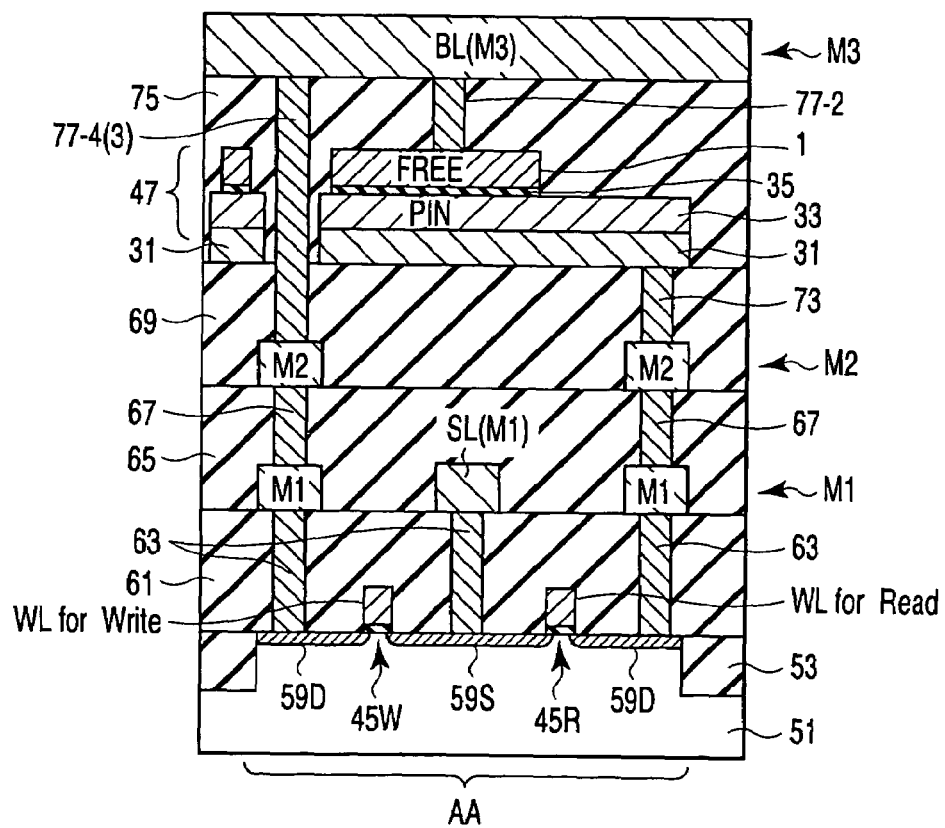
FIG. 10 is a cross-sectional view showing an example of the structure of the third example of the memory cell provided in the semiconductor integrated circuit device according to the first embodiment of this invention.

FIG. 10 is a cross-sectional view showing an example of the structure of the third example of the memory cell provided in the semiconductor integrated circuit device according to the first embodiment of this invention.

In FIG. 10, the same reference symbols are attached to portions which are the same as those of FIG. 6 and the repetitive explanation thereof is omitted.

As shown in FIG. 10, in the memory cell of the third example, a fourth-layered plug 77-4 of the fourth-layered plug 77 which corresponds to the write plug 3 is formed to penetrate through the magneto-resistive effect element 47 and lead electrode 31 and extend from the bit line BL (third-layered metal layer M3) to the second-layered metal layer M2. The bit line BL is connected to the drain region 59D of the write selection transistor 45W via the fourth-layered plug 77-4, second-layered metal layer (M2), second-layered plug 67, first-layered metal layer (M1) and first-layered plug 63. Further, the bit line BL is connected to the free layer 1 of the magneto-resistive effect element 47 via a fourth-layered plug 77-2. The fixed layer 31 of the magneto-resistive effect element 47 is connected to the drain region 59D of the read selection transistor 45R via the lead electrode 31, third-layered plug 73, second-layered metal layer (M2), second-layered plug 67, first-layered metal layer (M1) and first-layered plug 63.

For example, in the memory cell of the third example, the bit line used at the data write time can be separated from the bit line used at the data readout time. In this case, the parasitic capacitance of the read bit line can be further reduced and a memory in which the read operation can be performed at high speed can be realized.

(Second Embodiment)

Figure 11:
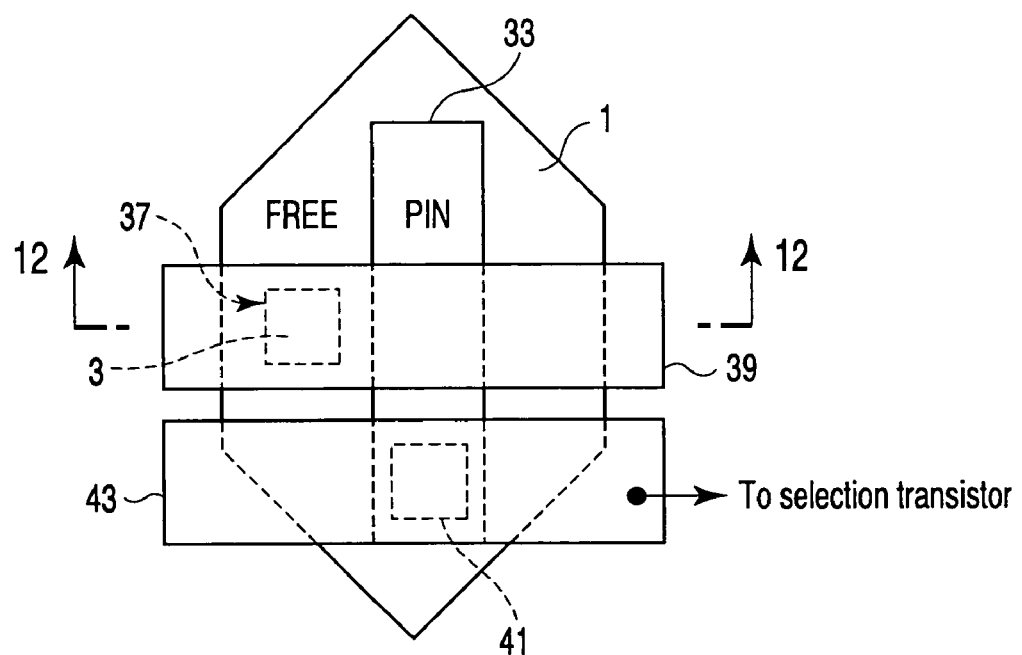
FIG. 11 is a plan view showing an example of the structure of a magneto-resistive effect element provided in a semiconductor integrated circuit device according to a second embodiment of this invention.
Figure 12:
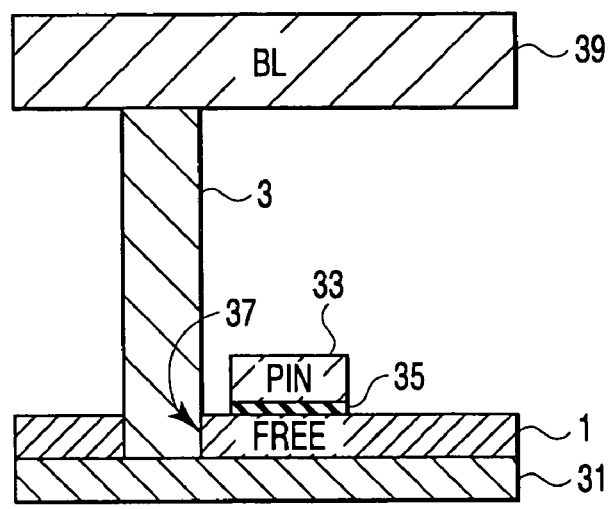
FIG. 12 is a cross-sectional view taken along the 12—12 line of FIG. 11.

FIG. 11 is a plan view showing an example of the structure of a magneto-resistive effect element provided in a semiconductor integrated circuit device according to a second embodiment of this invention and FIG. 12 is a cross-sectional view taken along the 12—12 line of FIG. 11.

As shown in FIGS. 11, 12, a magneto-resistive effect element 47 in the second embodiment is different from the magneto-resistive effect element 47 of the first embodiment in that a fixed layer 33 is formed above a free layer 1. That is, in the second embodiment, the positional relation of the free layer 1 and fixed layer 33 is opposite to that of the first embodiment. In this specification, the structure in the first embodiment is called a bottom pin structure and the structure in the second embodiment is called a top pin structure.

In the bottom pin structure, since the circular free layer 1 is formed above the fixed layer 33, the fixed layer 33 is required to be made larger than the circular free layer 1. Therefore, the plane area of the magneto-resistive effect element 47 becomes larger than the plane area of the free layer 1.

On the other hand, in the top pin structure, the fixed layer 33 is formed above the free layer 1. Unlike the free layer 1, the fixed layer 33 is not required to be formed in a circular configuration to surround the write plug 3. For example, the fixed layer 33 may be formed in a rectangular configuration and formed above the circular free layer 1. If the size of the fixed layer 33 is set smaller than the size of the circular free layer 1, the plane area of the magneto-resistive effect element 47 can be set to the same as the plane area of the free layer 1.

Further, in the bottom pin structure, since the free layer 1 cannot be formed in contact with the write plug 3, it becomes necessary to set an alignment margin with respect to the size of the opening 37.

On the other hand, in the top pin structure, since the free layer 1 can be formed in contact with the write plug 3, it becomes unnecessary to set an alignment margin with respect to the size of the opening 37.

Thus, the plane area of the magneto-resistive effect element can be easily reduced in the magneto-resistive effect element of the top pin structure in comparison with the magneto-resistive effect element of the bottom pin structure. Therefore, the advantage that the integration density can be easily enhanced can be attained.

Next, an example of a memory cell using the above magneto-resistive effect element is explained.

(Second Embodiment: First Example of Memory Cell)

Figure 13:
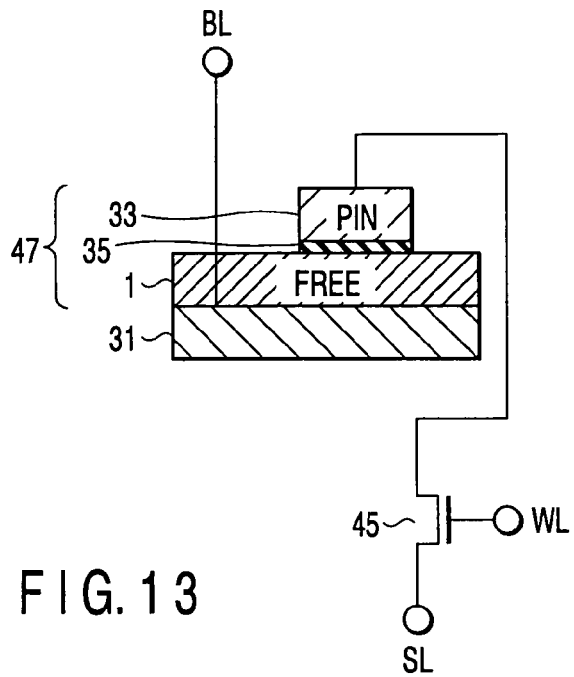
FIG. 13 is an equivalent circuit diagram showing a first example of a memory cell provided in the semiconductor integrated circuit device according to the second embodiment of this invention.

FIG. 13 is an equivalent circuit diagram showing a first example of a memory cell provided in the semiconductor integrated circuit device according to the second embodiment of this invention.

As shown in FIG. 13, the memory cell according to the first example of the second embodiment is 1T1MTJ. The memory cell according to the first example of the second embodiment is different from the memory cell according to the first example of the first embodiment in that the magneto-resistive effect element 47 is of the top pin structure. The other portions are the same as those of the memory cell according to the first example of the first embodiment.

Figure 14:
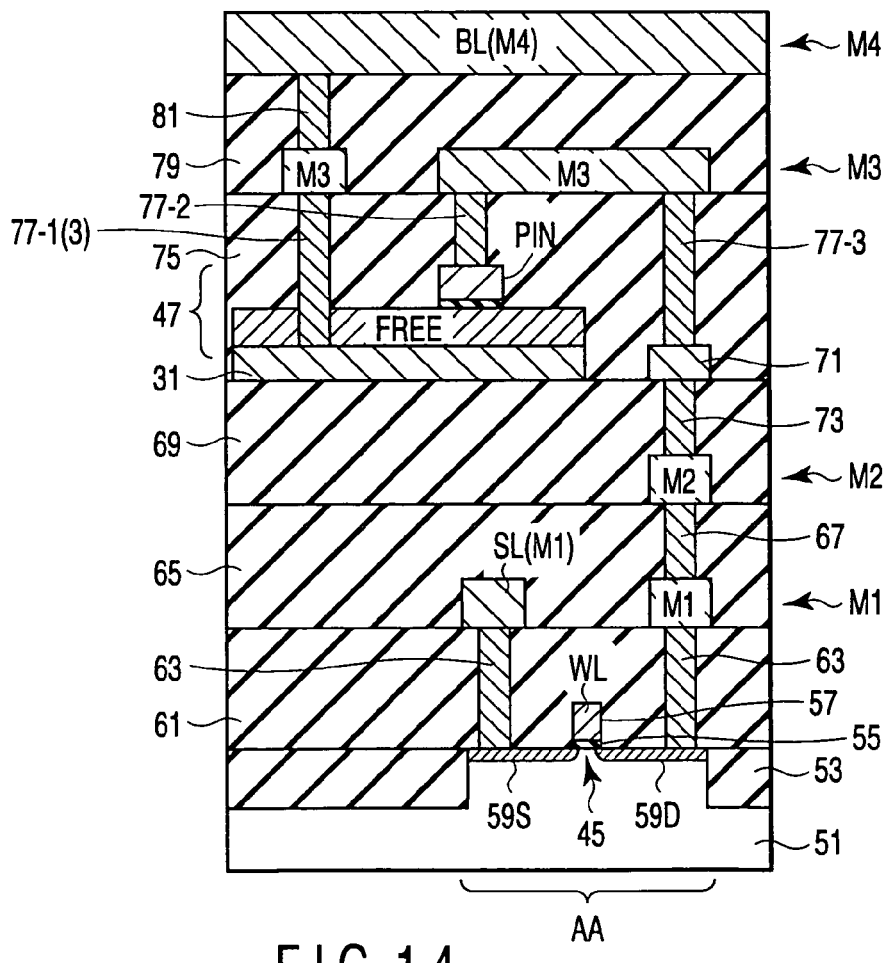
FIG. 14 is a cross-sectional view showing an example of the structure of the first example of the memory cell provided in the semiconductor integrated circuit device according to the second embodiment of this invention.

FIG. 14 is a cross-sectional view showing an example of the structure of the first example of the memory cell provided in the semiconductor integrated circuit device according to the second embodiment of this invention.

In FIG. 14, the same reference symbols are attached to portions which are the same as those of FIG. 6 and the repetitive explanation thereof is omitted.

(Second Embodiment: Second Example of Memory Cell)

Figure 15:
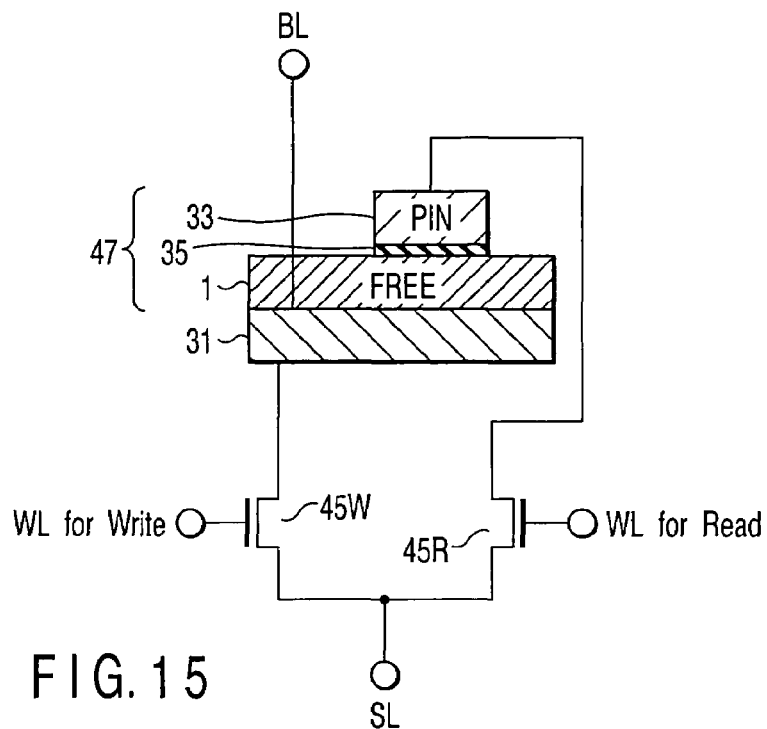
FIG. 15 is an equivalent circuit diagram showing a second example of the memory cell provided in the semiconductor integrated circuit device according to the second embodiment of this invention.

FIG. 15 is an equivalent circuit diagram showing a second example of the memory cell provided in the semiconductor integrated circuit device according to the second embodiment of this invention.

As shown in FIG. 15, the memory cell in the second example of the second embodiment is 2T1MTJ. The memory cell in the second example of the second embodiment is different from the memory cell in the second example of the first embodiment in that the magneto-resistive effect element 47 is of the top pin structure. The other portions are the same as those of the memory cell in the second example of the first embodiment.

Figure 16:
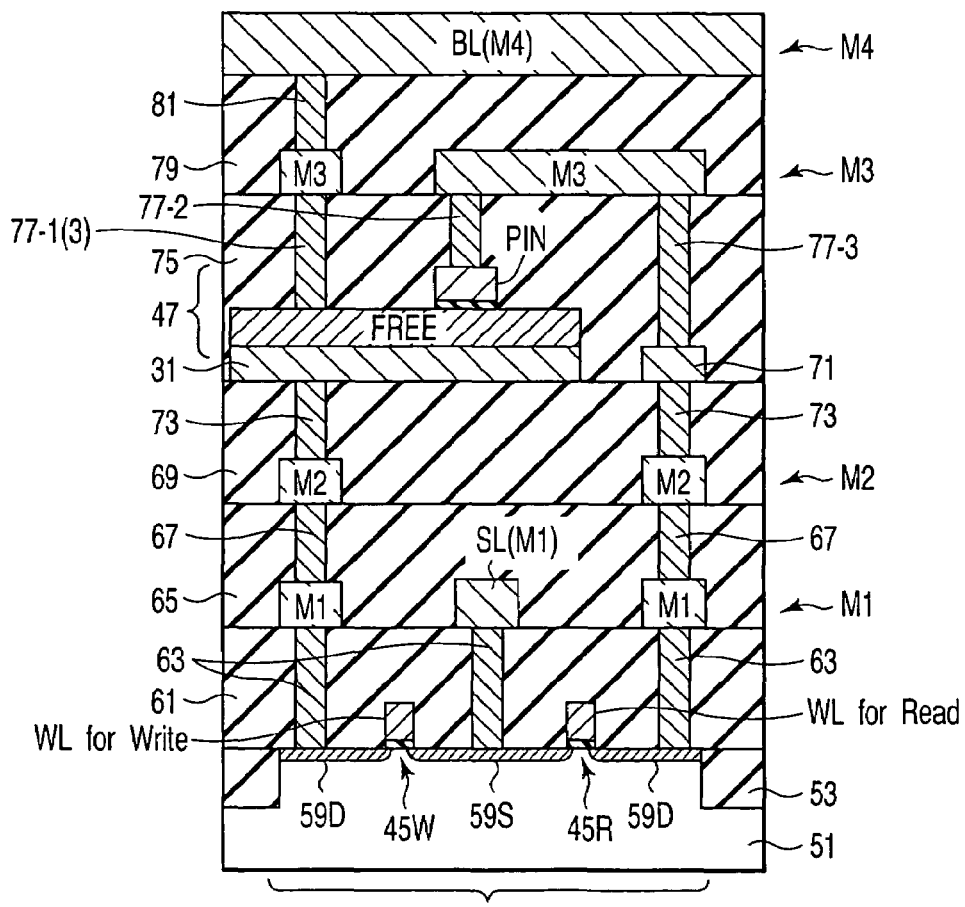
FIG. 16 is a cross-sectional view showing an example of the structure of the second example of the memory cell provided in the semiconductor integrated circuit device according to the second embodiment of this invention.

FIG. 16 is a cross-sectional view showing an example of the structure of the second example of the memory cell provided in the semiconductor integrated circuit device according to the second embodiment of this invention.

In FIG. 16, the same reference symbols are attached to portions which are the same as those of FIG. 8 and the repetitive explanation thereof is omitted.

In the memory cell in the second example, a current flowing between the bit line BL and the source line SL flows relatively linearly in portions above and below the free layer in comparison with that in the case of the memory cell of the first example by further providing a plug directly below the plug which penetrates through the free layer. As a result, the spatial distribution of the magnetic field intensity at the write time is improved and a more stable write characteristic can be realized.

Note that plug 73 is provided immediately below the plug 77-1. Hence, most of the write current flowing from the plug 77-1 into the plug 73 is concentrated at a portion of the free layer 1 between the plug 77-1 and the plug 73, as shown in FIG. 16, the plug 77-1 does not penetrate the free layer 1. This makes it unnecessary to etch, for example, the free layer 1.

(Second Embodiment: Third Example of Memory Cell)

Figure 17:
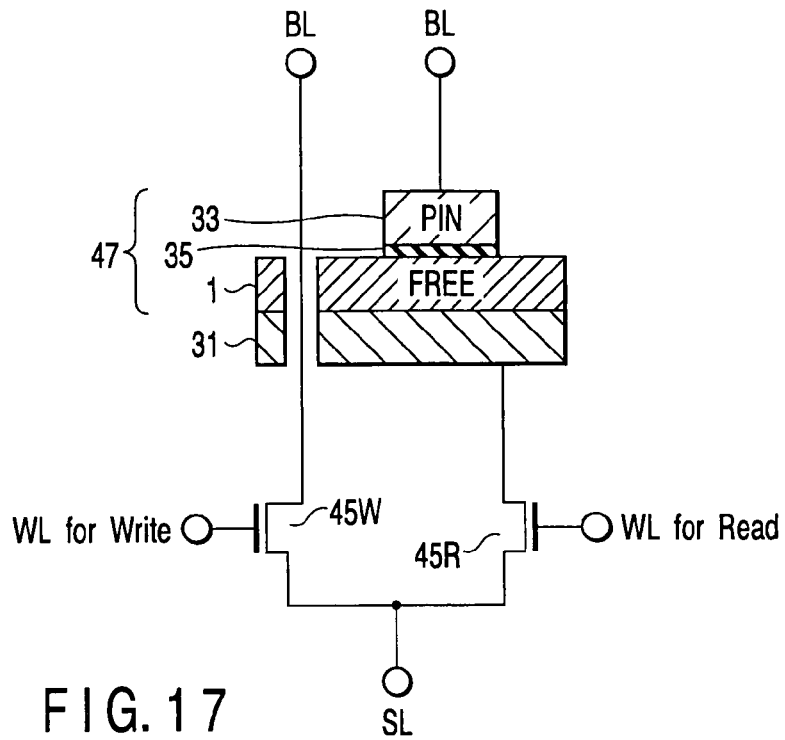
FIG. 17 is an equivalent circuit diagram showing a third example of the memory cell provided in the semiconductor integrated circuit device according to the second embodiment of this invention.

FIG. 17 is an equivalent circuit diagram showing a third example of the memory cell provided in the semiconductor integrated circuit device according to the second embodiment of this invention.

As shown in FIG. 17, the memory cell in the third example of the second embodiment is 2T1MTJ. The memory cell in the third example of the second embodiment is different from the memory cell in the third example of the first embodiment in that the magneto-resistive effect element 47 is of the top pin structure. The other portions are the same as those of the memory cell in the third example of the first embodiment.

Figure 18:
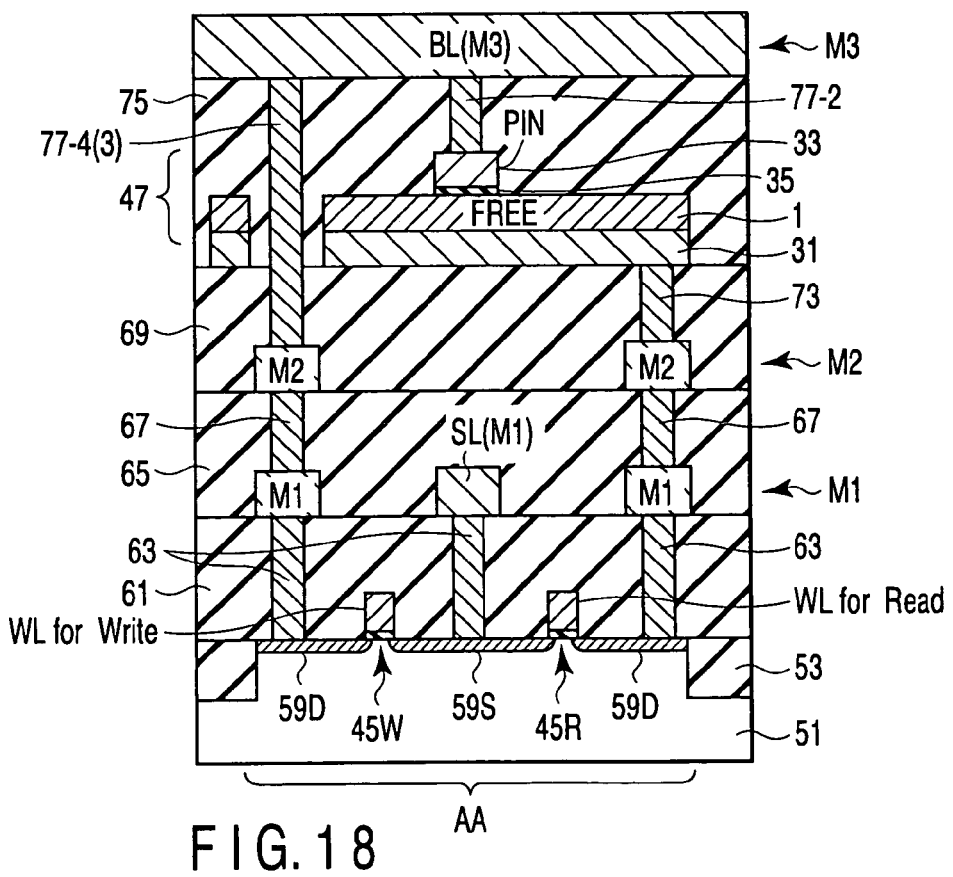
FIG. 18 is a cross-sectional view showing an example of the structure of the third example of the memory cell provided in the semiconductor integrated circuit device according to the second embodiment of this invention.

FIG. 18 is a cross-sectional view showing an example of the structure of the third example of the memory cell provided in the semiconductor integrated circuit device according to the second embodiment of this invention.

In FIG. 18, the same reference symbols are attached to portions which are the same as those of FIG. 10 and the repetitive explanation thereof is omitted.

In the memory cell in the third example, the bit line used at the data write time can be separated from the bit line used at the data readout time, for example. In this case, the parasitic capacitance of the read bit line can be further reduced and a memory in which the read operation can be performed at high speed can be realized.

(Second Embodiment: Fourth Example of Memory Cell)

Figure 19:
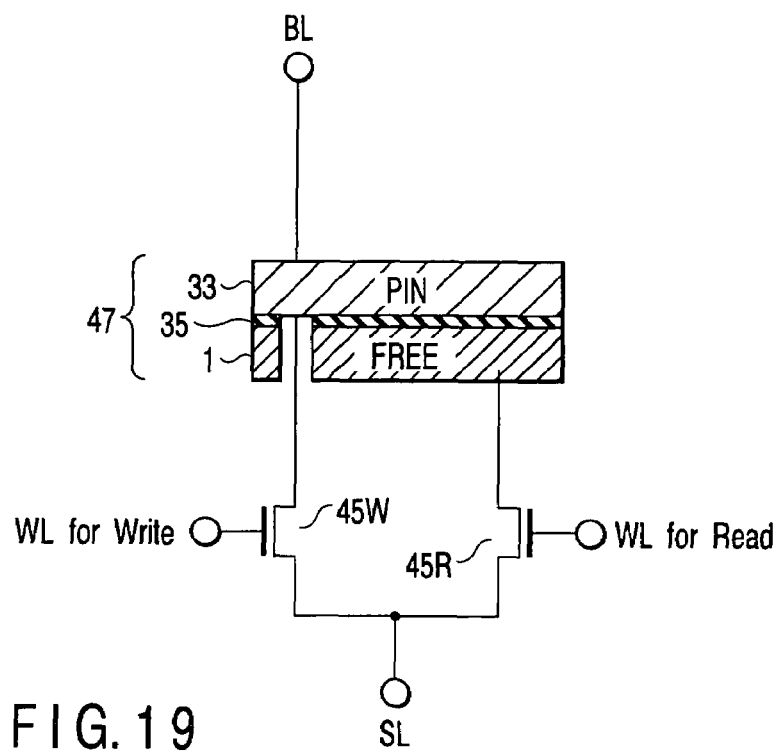
FIG. 19 is an equivalent circuit diagram showing a fourth example of the memory cell provided in the semiconductor integrated circuit device according to the second embodiment of this invention.

FIG. 19 is an equivalent circuit diagram showing a fourth example of the memory cell provided in the semiconductor integrated circuit device according to the second embodiment of this invention.

As shown in FIG. 19, the memory cell of the fourth example is 2T1MTJ of the top pin structure. The memory cell in the fourth example is different from the memory cell in the third example of the second embodiment in that the bit line BL is connected to the write selection transistor 45W via the fixed layer 33 of the magneto-resistive effect element 47.

In the memory cell of the fourth example, an electrical connection path (plug) between the bit line BL and the write selection transistor 45W and an electrical connection path (plug) between the bit line BL and the magneto-resistive effect element 47 can be commonly used. Therefore, for example, the number of plugs connected to the conductive layers formed below the bit lines BL can be reduced in comparison with that of the third example of the second embodiment and it is advantageous to miniaturize the memory cells.

Figure 20:
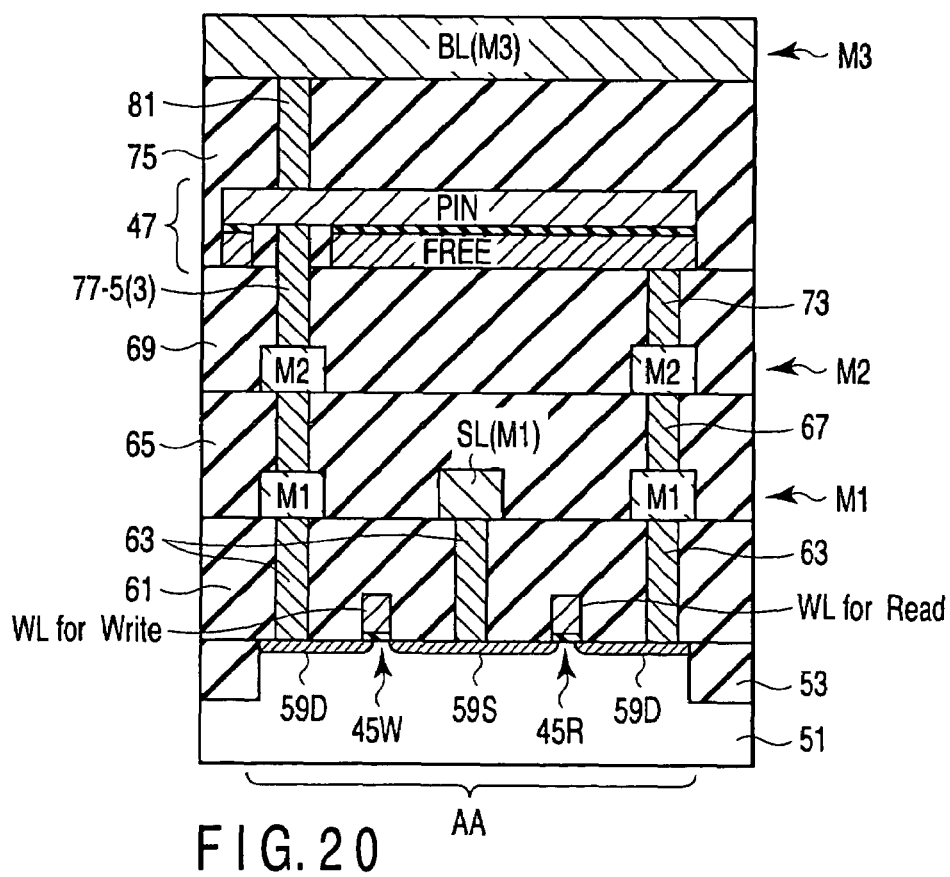
FIG. 20 is a cross-sectional view showing an example of the structure of the fourth example of the memory cell provided in the semiconductor integrated circuit device according to the second embodiment of this invention.

FIG. 20 is a cross-sectional view showing an example of the structure of the fourth example of the memory cell provided in the semiconductor integrated circuit device according to the second embodiment of this invention.

As shown in FIG. 20, a fifth-layered plug 81 is formed in a fourth-layered inter-level insulating film 75 to connect the bit line BL to the fixed layer 33. A fourth-layered plug 77-5 (write plug 3) is formed in the opening 37 of the free layer 1 and third-layered inter-level insulating film 69 to connect the fixed layer 33 to the second-layered metal layer (M2). The fourth-layered plug 77-5 is isolated from the free layer 1 with an insulating film 83 disposed therebetween and formed in the opening 37, for example. The other portions are the same as those of the memory cell in the third example of the second embodiment.

The fourth-layered plug 77-5 is formed to electrically connect the bit line BL to the fixed layer 33, but a lead electrode may be formed and the bit line BL may be electrically connected to the lead electrode. In this case, the fixed layer 33 is electrically connected to the lead electrode.

(Third Embodiment)

As is explained in the first embodiment with reference to FIG. 2D, the magnetic domain wall is gradually driven from the right region towards the left region of the free layer 1 by the exchange interaction after the write current is interrupted. However, the magnetic moments of the left region are originally set parallel to the direction of the write magnetic field according to the example of FIGS. 2A to 2E. If the free layer 1 itself becomes the single magnetic domain under no magnetic field, the magnetic moments of the left region is reversed according to the magnetic moments of the right region by the exchange interaction and the magnetic moments are uniformly aligned. However, only if the free layer 1 itself has a strong tendency toward the single magnetic domain (for example, if the free layer 1 does not completely become the single magnetic domain), it is assumed that the magnetic moments of the left region will not be reversed. In this case, for example, the magnetic domain walls remain between the left region and the upper region and between the left region and the lower region.

The magnetic domain wall is a region occurring in a process of reversing the magnetic moments by 180° and the magnetic moments in the magnetic domain wall gradually changes from 0° to 180° in a clockwise or counterclockwise direction. The magnetic domain wall has certain width. The width of the magnetic domain wall is reduced. Further, a region in which the magnetic domain wall is formed is set closer to the left region to reduce the width of the left region. By applying the above device to the free layer 1, the magnetic moments of the left region tends to be aligned with the magnetic moments of the right region. In the third embodiment, the above device is applied to the free layer 1.

FIG. 21A is a plan view showing an example of the structure of a magneto-resistive effect element provided in a semiconductor integrated circuit device according to a third embodiment of this invention. FIG. 21B is a plan view showing a free layer shown in FIG. 21A, FIG. 22 is a cross-sectional view taken along the 22—22 line of FIG. 21A and FIG. 23 is a cross-sectional view taken along the 23—23 line of FIG. 21A.

As shown in FIGS. 21A to 23, in the third embodiment, magnetic domain wall traps 91 are provided on the free layer 1 of the magneto-resistive effect element. One example of the magnetic domain wall trap 91 is a step difference formed on the free layer 1. The magnetic domain wall trap 91 of this example is a step difference and has a concave portion which is concave in a direction from a bit line BL toward the semiconductor substrate in the free layer 1. Of course, the step difference may be a convex portion which is convex in a direction from the semiconductor substrate toward the bit line BL. The magnetic domain wall is trapped by the magnetic domain wall trap 91 after a write current is interrupted. If the width of the magnetic domain wall trap 91 is reduced and a region sandwiched between the magnetic domain wall traps 91 is narrowed, the left region can be narrowed. Further, the distance between the left region and the upper region and the distance between the left region and the lower region can be reduced. As a result, the magnetic moments in the left region can be aligned with those of the upper region and lower region by the exchange interaction caused in the upper region and lower region, for example. Therefore, the magnetic moments of the left region is aligned with the magnetic moments of the right region.

A region having the magnetic domain wall traps 91 formed therein is formed in a region which lies near the write plug 3 and in which the magnetic domain wall is desired to be trapped. A concrete example of the region in which the magnetic domain wall traps 91 are formed is as follows.

FIG. 24 is a plan view showing regional division of the free layer of the magneto-resistive effect element provided in a semiconductor integrated circuit device according to the third embodiment of this invention.

As shown in FIG. 24, when the write plug 3 lies in a position deviated from the center of mass 9 of the free layer 1, the free layer 1 is divided into two regions including a region 101 containing the center of mass 9 and a region 103 containing the write plug 3. Assume that the direction in which the free layer 1 is divided into the regions 101 and 103 is the axis of easy magnetization (easy axis). In other words, when the free layer 1 is divided along the easy axis, the free layer 1 is divided into two regions including the region 101 containing the center of mass 9 and the region 103 containing the write plug 3. The easy axis is set in the long axis direction of the free layer 1, for example. A direction perpendicular to the easy axis is the axis of hard magnetization (hard axis). The hard axis is set in the short axis direction of the free layer 1, for example. The write plug 3 is deviated from the center of mass 9 of the free layer 1 along the hard axis.

When the region 103 is divided along the hard axis, it can be divided into three regions including a region 105 adjacent to the write plug 3 along the easy axis and regions 107, 109 which do not extend along the easy axis of the write plug 3.

For example, the region 107 is the upper region shown in FIGS. 2A to 2E and the region 109 is the lower region. A region 111 which is contained in the region 101 and is not contained in the regions 107, 109 is the right region. The region 105 which is contained in the region 103 and lies adjacent to the write plug 3 along the easy axis is the left region.

The magnetic domain wall moves from the region 101 toward the region 103 after the write current is interrupted. Therefore, the magnetic domain wall traps 91 may be formed in the region 103.

If the magnetic domain wall traps 91 are formed in the region 105 among the region 103 which is adjacent to the write plug 3 along the easy axis, the left region can be further narrowed. If it is desired to more uniformly align the magnetic moments of the free layer 1 to a certain direction, the magnetic domain wall traps 91 may be formed in the region 105.

According to the third embodiment, since the magnetic domain wall traps 91 are formed in the free layer 1, the width of the magnetic domain wall can be narrowed and an advantage that the magnetic moments of the free layer 1 can be easily and uniformly aligned to a certain direction can be attained.

(Fourth Embodiment)

FIG. 25A is a plan view showing a first example of the structure of a magneto-resistive effect element provided in a semiconductor integrated circuit device according to a fourth embodiment of this invention and FIG. 25B is a plan view showing a free layer shown in FIG. 25A. FIG. 26A is a plan view showing a second example of the structure of the magneto-resistive effect element provided in the semiconductor integrated circuit device according to the fourth embodiment of this invention and FIG. 26B is a plan view showing a free layer shown in FIG. 26A.

The fourth embodiment is an example in which a portion of the free layer 1 containing a region into which the magnetic domain wall moves after the write current is interrupted, in this example, a portion containing the left region is formed in a self-aligned manner with respect to the write plug 3.

For example, in the first example of the structure shown in FIGS. 25A, 25B, a portion containing the left region with respect to the free layer 1 of the second embodiment is formed in a self-aligned manner with respect to the write plug 3.

For example, in the second example of the structure shown in FIGS. 26A, 26B, a portion containing the left region with respect to the free layer 1 having the magnetic domain wall traps 91 of the second embodiment is formed in a self-aligned manner with respect to the write plug 3.

A manufacturing method of the magneto-resistive effect element according to the fourth embodiment is explained below.

FIGS. 27 to 33 are cross-sectional views showing an example of a manufacturing method of the magneto-resistive effect element provided in the semiconductor integrated circuit device according to the fourth embodiment of this invention.

Figure 27:
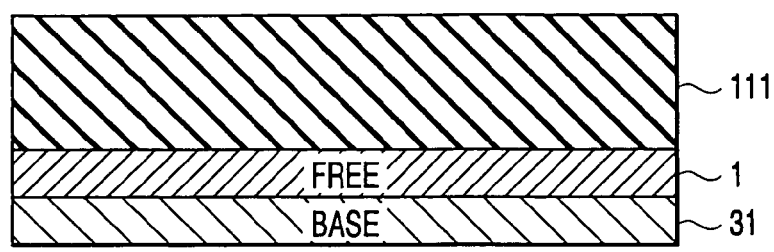
FIG. 27 is a cross-sectional view showing an example of a step in a manufacturing method of the magneto-resistive effect element provided in the semiconductor integrated circuit device according to the fourth embodiment of this invention.

First, as shown in FIG. 27, a magnetic layer is formed on a lead electrode (BASE) 31 to form a free layer (FREE) 1. Then, a film 111 is formed on the free layer 1. The film 111 is a film used for formation of burying holes to form write plugs 3 by use of a damascene method. As a material of the film 111, a material having a certain selective etching ratio with respect to a material of the write plug 3 can be used. In this example, a silicon dioxide film is used as one example. Of course, the write plug 3 may be formed by a manufacturing method other than the damascene method.

Figure 28:
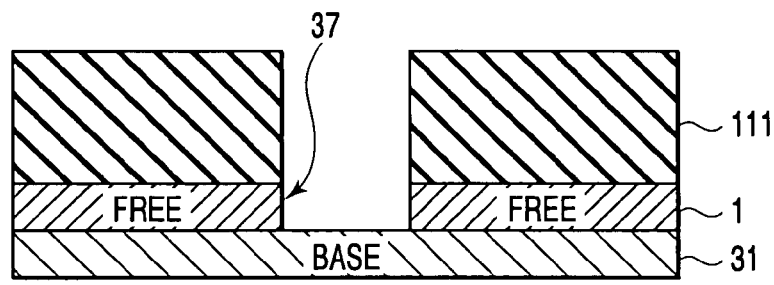
FIG. 28 is a cross-sectional view showing an example of a step in the manufacturing method of the magneto-resistive effect element provided in the semiconductor integrated circuit device according to the fourth embodiment of this invention.

Next, as shown in FIG. 28, for example, an opening 37 is formed in the film 111 and free layer 1 to expose the lead electrode 31 by use of the photolithography technology.

Figure 29:
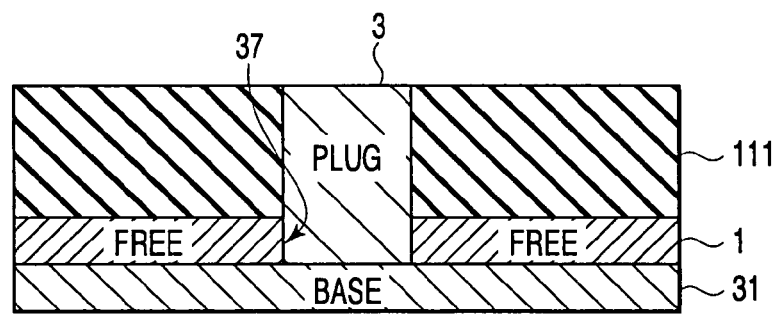
FIG. 29 is a cross-sectional view showing an example of a step in the manufacturing method of the magneto-resistive effect element provided in the semiconductor integrated circuit device according to the fourth embodiment of this invention.

After this, as shown in FIG. 29, a conductive layer is formed on the lead electrode 31 and the film 111 having the opening 37 formed therein. The conductive layer is formed in contact with the lead electrode 31 via the opening 37. Then, the conductive layer is ground by a chemical-mechanical polishing process to leave the conductive layer in the opening 37. Thus, a write plug 3 is formed (damascene method).

Figure 30:
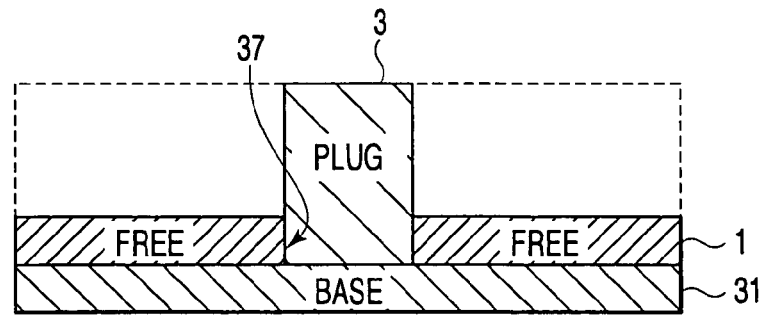
FIG. 30 is a cross-sectional view showing an example of a step in the manufacturing method of the magneto-resistive effect element provided in the semiconductor integrated circuit device according to the fourth embodiment of this invention.

Next, as shown in FIG. 30, the film 111 is removed and the write plug 3 is left behind in a column form.

Figure 31:
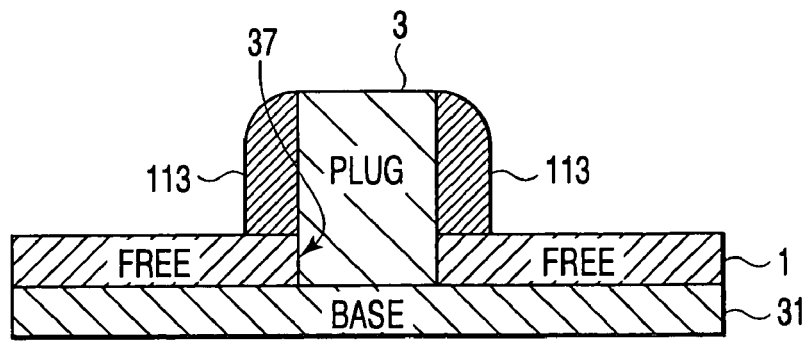
FIG. 31 is a cross-sectional view showing an example of a step in the manufacturing method of the magneto-resistive effect element provided in the semiconductor integrated circuit device according to the fourth embodiment of this invention.

Then, as shown in FIG. 31, a film 113 is formed on the free layer 1 and write plug 3. After this, the film 113 is subjected to the anisotropic etching process and left behind on the side surfaces of the write plug 3 in a side wall form. As a material of the film 113, a material having a certain selective etching ratio with respect to materials of the write plug 3, lead electrode 31 and free layer 1 can be used. For example, a material containing a material different from the material of the write plug 3, the material of the lead electrode 31 and the material of the free layer 1 may be used to form the film 113. In this example, a silicon nitride film is used as one example, but another insulating film or conductive film may be used.

Figure 32:
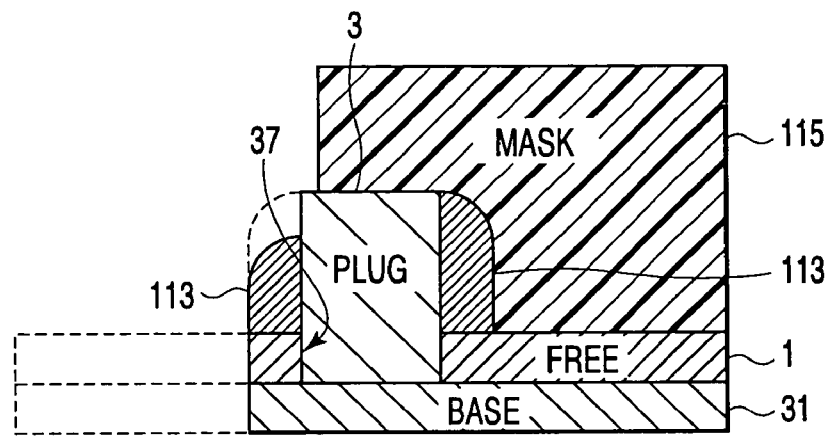
FIG. 32 is a cross-sectional view showing an example of a step in the manufacturing method of the magneto-resistive effect element provided in the semiconductor integrated circuit device according to the fourth embodiment of this invention.

Next, as shown in FIG. 32, a mask layer 115 is formed on the free layer 1 and the right region of the free layer 1 is covered with the mask layer 115, for example. Then, the free layer 1 and lead electrode 31 are selectively etched by using the film 113 and mask layer 115 as a mask. As a result, for example, a portion containing the left region of the free layer 1 is formed in a self-aligned manner with respect to the write plug 3.

Figure 33:
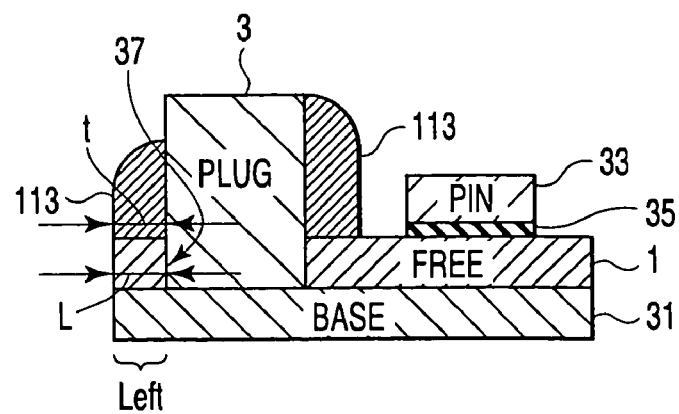
FIG. 33 is a cross-sectional view showing an example of a step in the manufacturing method of the magneto-resistive effect element provided in the semiconductor integrated circuit device according to the fourth embodiment of this invention.

After this, as shown in FIG. 33, a tunnel insulating film 35 is formed, for example, on the right region of the free layer 1 after the mask layer 115 is removed and then a magnetic layer 33 is formed on the tunnel insulating film 35. Next, the magnetic layer 33 and tunnel insulating film 35 are processed into the shape of a magneto-resistive effect element and thus a magneto-resistive effect element 47 is formed.

The magneto-resistive effect element according to the fourth embodiment can be formed by the manufacturing method shown in FIGS. 27 to 33, for example.

According to the fourth embodiment, since the left region is formed in a self-aligned manner with respect to the write plug 3, an advantage that the plane area of the free layer 1 can be reduced and the integration density can be easily enhanced can be attained. According to this example, the length "L" of the left region from the side surface of the plug 3 is determined by the thickness "t" of the film 113 from the side surface of the plug 3. In the structure, a portion of the end portion of the film 113 is aligned with a portion of the end portion of the free layer 1.

According to the embodiment of this invention, a magnetic semiconductor memory having the magneto-resistive effect element in which the efficiency of generation of a magnetic field with respect to a current is high can be attained.

This invention has been explained with reference to some embodiments, but this invention is not limited to the above embodiments and can be variously modified without departing from the technical scope thereof.

The embodiments can be independently performed and adequately combined and performed.

Further, the above embodiments contain inventions of various stages and the inventions of various stages can be extracted by adequately combining a plurality of constituents disclosed in the embodiments.

Further, the embodiments are explained based on the examples in which the invention is applied to the magnetic semiconductor memory, but this invention is not limited to the magnetic semiconductor memory. A semiconductor integrated circuit device containing the magnetic semiconductor memory, for example, a processor or system LSI is contained in the scope of this invention.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor integrated circuit device comprising:
   a magneto-resistive effect element including a first magnetic layer whose magnetization direction is fixed and a second magnetic layer whose magnetization direction can be changed; and
   a plug formed to penetrate through the second magnetic layer in a film thickness direction of the second magnetic layer, the plug being used to apply a write magnetic field to the second magnetic layer;
   wherein magnetic moments of the second magnetic layer are substantially in a same direction under a zero magnetic field.

2. The device according to claim 1, wherein the plug is set in a position deviated from the center of mass of the second magnetic layer.

3. The device according to claim 2, further comprising:
   a selection transistor electrically connected to the second magnetic layer; and
   a bit line electrically connected to the first magnetic layer, the bit line being electrically connected to the selection transistor via the first and second magnetic layers.

4. The device according to claim 3, wherein the second magnetic layer contains magnetic domain wall traps.

5. The device according to claim 4, wherein the magnetic domain wall trap is a step difference formed on the second magnetic layer.

6. The device according to claim 2, further comprising:
   a selection transistor electrically connected to the first magnetic layer; and
   a bit line electrically connected to the second magnetic layer, the bit line being electrically connected to the selection transistor via the second and first magnetic layers.

7. The device according to claim 6, wherein the second magnetic layer contains magnetic domain wall traps.

8. The device according to claim 7, wherein the magnetic domain wall trap is a step difference formed on the second magnetic layer.

9. The device according to claim 2, further comprising films of a side wall shape formed on side surfaces of the plug, a portion of the end portion of the film being aligned with a portion of the end portion of the second magnetic layer.

10. The device according to claim 9, wherein the second magnetic layer contains magnetic domain wall traps.

11. The device according to claim 10, wherein the magnetic domain wall trap is a step difference formed on the second magnetic layer.

12. The device according to claim 2, wherein the second magnetic layer contains magnetic domain wall traps.

13. The device according to claim 7, wherein the magnetic domain wall trap is a step difference formed on the second magnetic layer.

14. The device according to claim 1, wherein the second magnetic layer contains magnetic domain wall traps.

15. The device according to claim 14, wherein the magnetic domain wall trap is a step difference formed on the second magnetic layer.

16. The device according to claim 1, further comprising:
   a tunnel insulating film provided between the first magnetic layer and the second magnetic layer.

* * * * *